United States Patent [19]

Kearsley et al.

[11] Patent Number: 4,897,753

[45] Date of Patent: Jan. 30, 1990

[54] LASERS

[76] Inventors: Andrew J. Kearsley, 11 Eaton Court, Water Eaton Road, Oxford; Graham A. Naylor, 40 Great Close Road, Yarnton, Oxfordshire, both of Great Britain

[21] Appl. No.: 72,980
[22] PCT Filed: Sep. 19, 1986
[86] PCT No.: PCT/GB86/00561
§ 371 Date: May 18, 1987
§ 102(e) Date: May 18, 1987
[87] PCT Pub. No.: WO87/01882
PCT Pub. Date: Mar. 26, 1987

[30] Foreign Application Priority Data

Sep. 19, 1985 [GB] United Kingdom ............... 8523216

[51] Int. Cl.$^4$ .............................. H02H 3/00
[52] U.S. Cl. ....................... 361/1; 307/108; 307/641; 307/639; 328/67
[58] Field of Search ............... 307/106, 108, 109, 415, 307/419, 252 J, 252 M, 284; 328/65, 67; 320/1; 361/1, 20

[56] References Cited

U.S. PATENT DOCUMENTS 3,881,120  4/1975  Osterwalder .......... 307/252 J X
4,684,820  8/1987  Valencia .............. 307/108 X

FOREIGN PATENT DOCUMENTS 1416571  12/1975  United Kingdom .
2005940   4/1979  United Kingdom .

OTHER PUBLICATIONS

"A High-Power Current Pulse Generator", Instruments and Experimental Techniques, vol. 25 (1982), Jul.-Aug. No. 4, Part 1, pp. 884–886.
"A Pulse Circuit for Excitation of a Partical Accelerator Electromagnet", Instruments and Experimental Techniques, vol. 17, No. 6, Part I, Nov./Dec. 1974, pp. 1563–1564.
"Simple Capacitor Charging Power Supply for a 100-pps Laser Pulser", Review of Scientific Instruments 56 (1985), Mar., No. 3, pp. 382–384.

Primary Examiner—Derek S. Jennings
Attorney, Agent, or Firm—Spencer & Frank

[57] ABSTRACT

A resonant power circuit which supplies pulsed power to a load, such as a pulsed laser, from a d.c. supply by cyclically charging a capacitor. The capacitor is discharged through the load on closure of a switch which should then open to allow the capacitor to re-charge. Occasionally the switch fails to open and the circuit of the invention then develops and applies a reverse voltage to the switch to force it to become an open circuit.

11 Claims, 2 Drawing Sheets

LASERS

BACKGROUND OF THE INVENTION

This invention relates to an electric circuit which provides protection to a power source supplying power to a load through a resonant circuit. In such ciruits a cyclical operation takes place in which a direct current power supply charges a capacitor and the power stored in the capacitor is then discharged through the load. The discharge supplies operating power to the load and the present invention applies in particular to a load which needs repetitive discharges over an extended period or for continuous operation.

In such circuits the discharge of the capacitor through the load can be initiated by a switch device which connects the fully-charged capacitor across the load. At the appropriate time it is necessary for the switch device to become open circuit so that the capacitor can recharge and the regular operation of the circuit requires that this should occur.

If the switch device fails to become open circuit it effectively presents a short circuit to the power supply and unless the switch becomes open circuit within a predetermined time, the protective circuits of the power supply will cause the power supply to switch off to prevent it being damaged. The present invention provides a protective circuit to prevent just such an occurrence.

SUMMARY OF THE INVENTION

According to the invention there is provided an electrical circuit comprising first capacitive means arranged to be charged from a power supply, switch means arranged to close for discharging said first capacitive means through a load and then to open to enable said first capacitive means to re-charge, characterised in that second capacitive means are connected across said switch means and current limiting means are arranged in the circuit between the power supply and said second capacitive means, whereby upon continued closure of said switch means said second capacitive means first discharges through said switch means and then applies a reverse voltage to said switch means causing opening of said switch means.

Preferably, said power supply is prevented from charging said second capacitive means in the event of continued closure of said switch means by said current limiting means.

Preferably also, means are provided for discharge of the energy in said current limiting means.

Preferably also, a detector is arranged to indicate if operation of said circuit occurs in excess of a predetermined rate.

BRIEF DESCRIPTION OF THE DRAWINGS

An embodiment of the invention will now be described, by way of example only, with reference to the accompanying drawings in which:-

DESCRIPTION OF A PREFERRED EMBODIMENT

Figure 1:
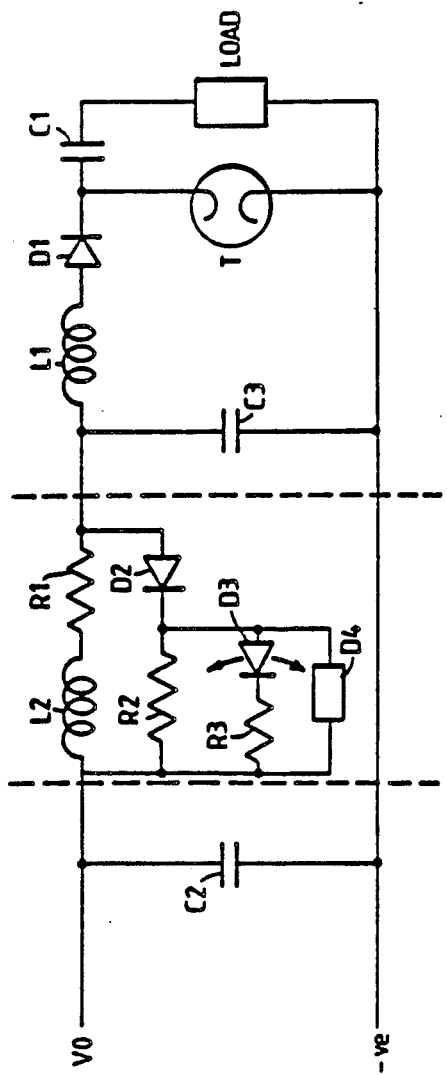
FIG. 1 is a circuit diagram for a laser discharge resonant circuit constructed in accordance with the invention.
Figure 2:
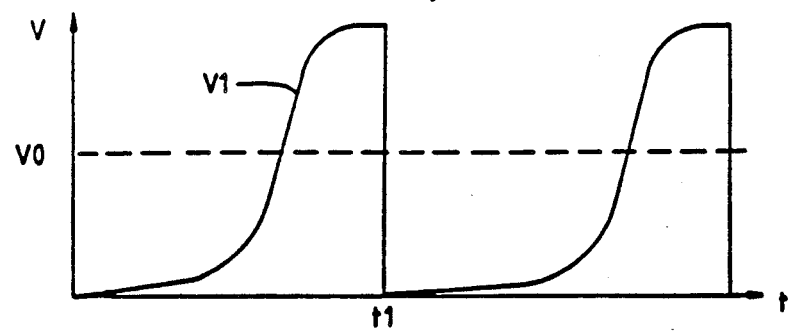
FIGS. 2 to 4 are voltage and current wave form diagrams.
Figure 3:
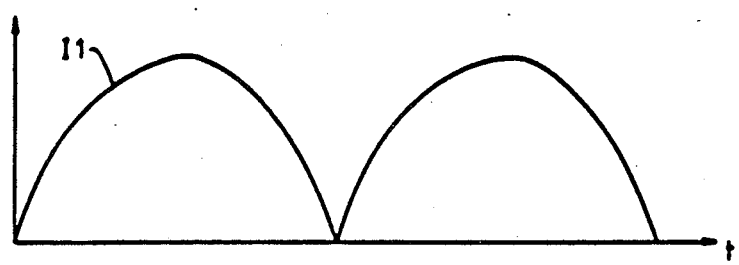

Referring first to the circuit outside (to the left and right of) the two broken lines of FIG. 1, there is shown a capacitor C1 arranged to be charged from a direct current voltage supply V0. When voltage V0 is applied current flows through inductor L1 and diode D1 to charge capacitor C1. The voltage V1 (FIG. 2) across capacitor C1 rises towards V0, the current I1 (FIG. 3) reaches a maximum and starts to decay. Inductor L1, which initially resists the current I1 flowing when voltage V0 is first applied, now resists decay of this current with the result that the voltage across capacitor C1 continues to rise and eventually reaches twice V0.

At time t1 thyratron T closes and connects capacitor C1 directly across the load. The load in this case is a pulsed metal vapour lase using a material such as copper as the vapour lasing medium. The charge which has been developed across capacitor C1 causes a discharge to travel down the discharge tube of the laser initiating lasing. Normally thyratron T then becomes open circuit after a short period and capacitor C1 is then recharged from the d.c. power supply. This mode of operation continues at a pulsed repetition rate of about 20 KHz.

Capacitor C2 is connected across the power supply for smoothing purposes and when thyratron T closes, capacitor C2 does not discharge through it to any great extent because inductor L1 limits the speed at which the current from capacitor C2 can build up through the short circuit of thyratron T.

From time to time quite randomly, thyratron T malfunctions and remains short circuited when the system requires it to go open circuit. In these circumstances the discharge from capacitor C2 continues and the short circuit which is continued to be applied across the power supply causes protective devices (not shown) of the power supply to operate and isolate the circuit thus causing the laser to cease operation.

Metal vapour lasers which are caused to stop operating then have to be fully re-initiated and this can take up to an hour to complete before the laser can be made to operate again. Unwanted closedown for this reason can be a major disadvantage with this kind of laser.

The components within the two broken lines in FIG. 1 constitute a circuit which provides protection to the system in the case of thyratron malfunction of this kind.

When the cycle starts capacitors C1, C2 and C3 are all charged from the voltage V0. When thyratron T closes capacitor C1 is discharged through the load but capacitors C2 and C3 are prevented from discharging to any great extent by the inductances L1 and L2.

Figure 4:
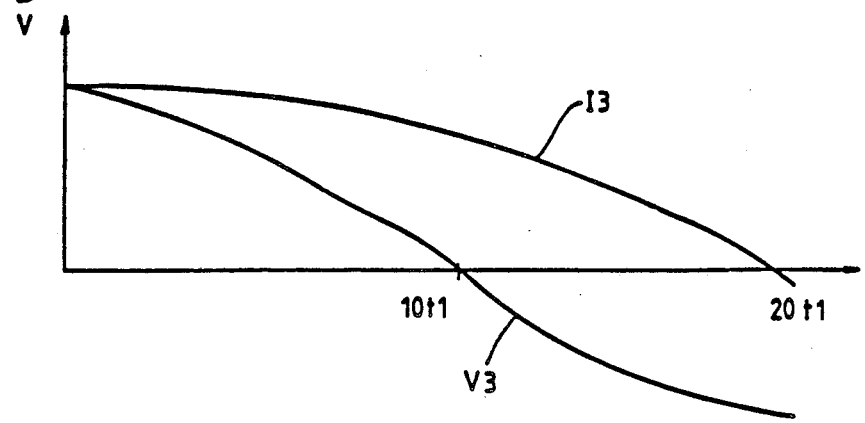

If thyratron T malfunctions and remains closed after the system requires it to go open circuit, capacitor C3 discharges through thyratron T while capacitor C2 is still prevented from discharging to any great extent due to the higher inductance of L2 as compared to L1. When the voltage V3 (FIG. 4, note the different timescale) across capacitor C3 reaches zero (at approximately time 10 * t1) and if thyratron T is still closed, the current I3 flowing starts to decay but this decay is resisted by the inductor L1; as a result, the voltage V3 reverses and the current I3 decays to zero and tries to reverse. The reverse voltage V3 is applied across thyratron T forcing it to become open circuit.

Because current flow from capacitor C2 is prevented from building up by inductor L2, capacitor C2 is discharged only slowly and the current from it is insufficient to affect the over-swing of voltage across capacitor C3 described above.

Operation of the circuit as described above does, however, build up energy in inductor L2 and after thyratron T has again become open circuit, this energy is discharged into resistors R1 and R2 through diode D2. Also, light emitting diode D3 flashes to give a visible indication of the discharge of L2 and detector D4 is arranged to count the rate of malfunction of the circuit. If this exceeds a predetermined rate, of the order of eight times per day, detector D4 gives an indication that the laser ought to be closed down for maintenance.

Recharging of capacitors C1 and C3 will take place in the normal manner after operation of the circuit to force open circuit of the thyratron T.

One additional aspect is that capacitor C3 would be capable of recharging to more than voltage V0 (up to twice voltage V0) by current flow from capacitor C2 through inductor L2; this would interfere with the desired functioning of the thyratron T. However, for low/average current circuits resistor R1 provides sufficient damping to limit this current and limit the voltage to V0.

In high power circuits diode D2 and resistor R2 remove any excess voltage from capacitor C3 and, in this case, resistor R1 can be reduced to zero or at least to the resistance provided by the windings of inductor L2. Resistor R2 is then chosen in value sufficient to damp out quickly the current which would circulate through inductor L2, diode D2 and resistor R2.

Typical circuit values of these components are:

| | | |
|---|---|---|
| L1 | 100 mH | |
| L2 | 1.5 H | |
| C1 | 8 nano Farads | |
| C2 | 10 micro Farads | |
| C3 | 2 micro Farads | |
| R1 | 0–10 K Ohms | |
| R2 | 0–10 K Ohms | |

We claim:

1. An electrical circuit comprising first capacitive means arranged to be charged from a power supply, a thyratron arranged to close for discharging said first capacitive means through a load and then to open to enable said first capacitive means to recharge, wherein the improvement comprises second capacitive means connected across said thyratron and current limiting means arranged in the circuit between the power supply and said second capacitive means, whereby upon continued closure of said thyratron said second capacitive means first discharges through said thyratron and then applies a reverse voltage to said thyratron causing opening of said thyratron.

2. An electrical circuit as claimed in claim 1, wherein said power supply is prevented from charging said second capacitive means in the event of continued closure of said thyratron by said current limiting means.

3. An electrical circuit as claimed in claim 2, wherein means are provided for discharge of the energy in said current limiting means.

4. An electrical circuit as claimed in claim 1, wherein a detector is arranged to give a visible indication when said thyratron is caused to go open circuit.

5. An electrical circuit as claimed in claim 1, wherein a detector is arranged to indicate if continued closure of said thyratron occurs in excess of a predetermined rate.

6. In combination with a first capacitor arranged to be charged from a power supply, a load connected in series with said first capacitor and a thyratron connected in parallel with said series-connected first capacitor and said load, whereby said thyratron under normal operating conditions periodically closes to discharge said first capacitor through said load and opens after a predetermined interval to terminate said discharge, said thyratron malfunctioning from time to time in a random manner so as to remain closed after said predetermined interval has elapsed thereby permitting continued discharge of said first capacitor through said load; an electrical circuit for forcing said thyratron to open in the event of said malfunction comprising a first inductor having one end connected to the junction of said first capacitor and said thyratron;

a second inductor connected between the other end of said first inductor and said power supply, the inductance of said second inductor being greater than the inductance of said first inductor; and a second capacitor connected between the junction of said first and second inductors and the junction of said thyratron and said load, said second capacitor being charged from said power supply through said second inductor and discharged through said first inductor and said thyratron when said thyratron malfunctions by remaining closed after said predetermined interval has elapsed, the polarity of the voltage across said second capacitor reversing after said predetermined interval has elapsed thereby forcing said thyratron to open and terminate the discharge of said first capacitor through said load.

7. An electrical circuit as claimed in claim 6 wherein said load is a metal vapor laser.

8. An electrical circuit as claimed in claim 6 which further comprises a resistor coupled across said second inductor to discharge the energy stored therein during charging of said first and second capacitors.

9. An electrical circuit as claimed in claim 8 which further comprises detecting means coupled across said resistor, said detecting means detecting discharge of the energy stored in said second inductor.

10. An electrical circuit as claimed in claim 9 wherein said detecting means is a light emitting diode.

11. An electrical circuit as claimed in claim 9 wherein a further detecting means is coupled to said detecting means, said further detecting means indicating when the discharge of energy from said second inductor exceeds a predetermined rate.

* * * * *